United States Patent
Horiike et al.

(10) Patent No.: US 6,461,533 B1
(45) Date of Patent: *Oct. 8, 2002

(54) ETCHANT FOR SILICON OXIDE AND METHOD

(75) Inventors: Yasuhiro Horiike, Hoya; Yoshio Ishikawa, Narita; Keiji Horioka, Chiba, all of (JP)

(73) Assignee: Applied Materials Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/090,476

(22) Filed: Jun. 4, 1998

(30) Foreign Application Priority Data

Sep. 30, 1997 (JP) .............................. 9-282688

(51) Int. Cl.[7] .............................. C09K 13/00
(52) U.S. Cl. .................. 252/79.1; 252/79.3; 252/79.4; 438/700; 438/706; 438/723; 438/725
(58) Field of Search ............................... 252/79.1, 79.3, 252/372, 79.4; 438/712, 723, 725, 706

(56) References Cited

U.S. PATENT DOCUMENTS

| | | | |
|---|---|---|---|
| 5,129,958 A | 7/1992 | Nagashima et al. ....... 134/22.1 |
| 5,362,526 A | 11/1994 | Wang et al. ................. 427/573 |
| 5,376,228 A * | 12/1994 | Yanagida ..................... 438/712 |
| 5,423,942 A * | 6/1995 | Marks et al. ................ 438/723 |
| 5,556,501 A | 9/1996 | Collins et al. .............. 156/345 |
| 5,571,571 A * | 11/1996 | Musaka et al. ............. 427/574 |
| 5,965,463 A * | 10/1999 | Cui et al. .................... 438/723 |

OTHER PUBLICATIONS

Wolf, Stanley et al.. Silicon Processing for the VLSI Era, vol. 1: Process Technology, Lattice Press, USA. pp. 407–409, 1986.*

* cited by examiner

Primary Examiner—Benjamin L. Utech
Assistant Examiner—Lynette T. Umez-Eronini
(74) Attorney, Agent, or Firm—Birgit Morris; Joseph Bach

(57) ABSTRACT

A method of etching silicon oxide with high selectivity to a photoresist mask and to a silicon-containing substrate comprising exposing the silicon oxide to a plasma of a precursor etch gas of a fluorocarbon and an organic silane containing at least one organic group. When at least about 10% by weight of the silane is present in the etch gas, the selectivity between the silicon oxide and the photoresist mask layer, and between the silicon oxide and the silicon-containing substrate, increases markedly. High aspect ratio, submicron size openings can be etched.

5 Claims, 3 Drawing Sheets

ETCHANT FOR SILICON OXIDE AND METHOD

The present invention is directed to an improved etchant and a method of etching high aspect ratio openings in silicon oxide layers. More particularly, the present invention is directed to an improved method of etching high aspect ratio openings in silicon oxide layers using a fluorocarbon etchant mixture.

BACKGROUND OF THE INVENTION

As the density of semiconductor devices on a silicon-containing substrate becomes higher and the size of the devices becomes smaller, etched openings made in various layers must have a smaller diameter, and thus openings have a higher aspect ratio (ratio of depth to diameter). This raises several serious problems. The selectivity, or difference in etch rate, between a patterning layer, such as a mask or photoresist layer, and the layer to be etched must be sufficient so that the resist is not etched away before the opening is made through the layer to the substrate. The selectivity between the layer to be etched and the substrate must also be such that the etch will stop when the substrate material is reached. Further, in order that the opening size is about the same at the top of the dielectric layer and at the bottom of the dielectric layer, straight walled, vertical openings must be made.

In recent years, the integration level of LSI devices has been increased, and two conductive layers separated by a dielectric layer, generally silicon oxide, are connected by means of vias made in the dielectric layer which are filled in with metal contacts. The dielectric layer must be planarized, as by chemical mechanical polishing, prior to depositing a second conductive layer thereover, and thus the dielectric layer must be fairly thick. When high aspect ratio, straight-walled openings are to be made in silicon oxide over a silicon-containing substrate using a fluorocarbon etchant, another problem arises; the etch stops after a certain depth has been reached, and prior to reaching the substrate. This is believed to be due to the deposit of unreactive, fluorine-containing polymers on the bottom of the opening that greatly slows or even stops the etch. The addition of oxygen to the etch gas has been tried to burn off the polymer deposit by oxidation or ashing, but has not been successful because the addition of oxygen also increases the etch rate of the mask layer so that the mask layer is etched away before opening have been made through the silicon oxide layer. Further, oxygen etches the mask layer isotropically, destroying the fine mask patterning. Thus the mask layer must be thickened, but this in turn makes it more difficult to etch straight walled, vertical openings because the aspect ratio is even higher than before. Current requirements for the mask layer are that it be as thin as possible to reduce the aspect ratio of the etched opening. Thus any corrosion or isotropic etching of the mask layer creates serious problems.

Still further, the etched opening should have straight, vertical sidewalls with a minimum of difference between the diameter at the top of the etched opening and the diameter at the bottom of the etched opening.

Thus a method of etching high aspect ratio, small diameter openings in silicon oxide layers has been sought that will etch anisotropically, eliminate the etch stop phenomenon, provide high selectivity between a mask or photoresist layer and the silicon oxide, and provide high selectivity between the silicon oxide and a silicon-containing substrate.

SUMMARY OF THE INVENTION

We have found an etchant that will plasma etch very small diameter, high aspect ratio openings in silicon oxide having a patterned photoresist mask layer thereover. The etchant of the invention does not degrade the profile of the mask pattern; provides excellent selectivity between the mask layer and the silicon oxide; and provides excellent selectivity between the silicon oxide and a silicon-containing substrate material. The etchant of the invention eliminates the stop etch problem as well.

The etchant of the invention comprises a plasma formed from a mixture of a fluorocarbon and an organic silane that includes hydrogen, silicon and carbon.

DETAILED DESCRIPTION OF THE INVENTION

Figure 1:
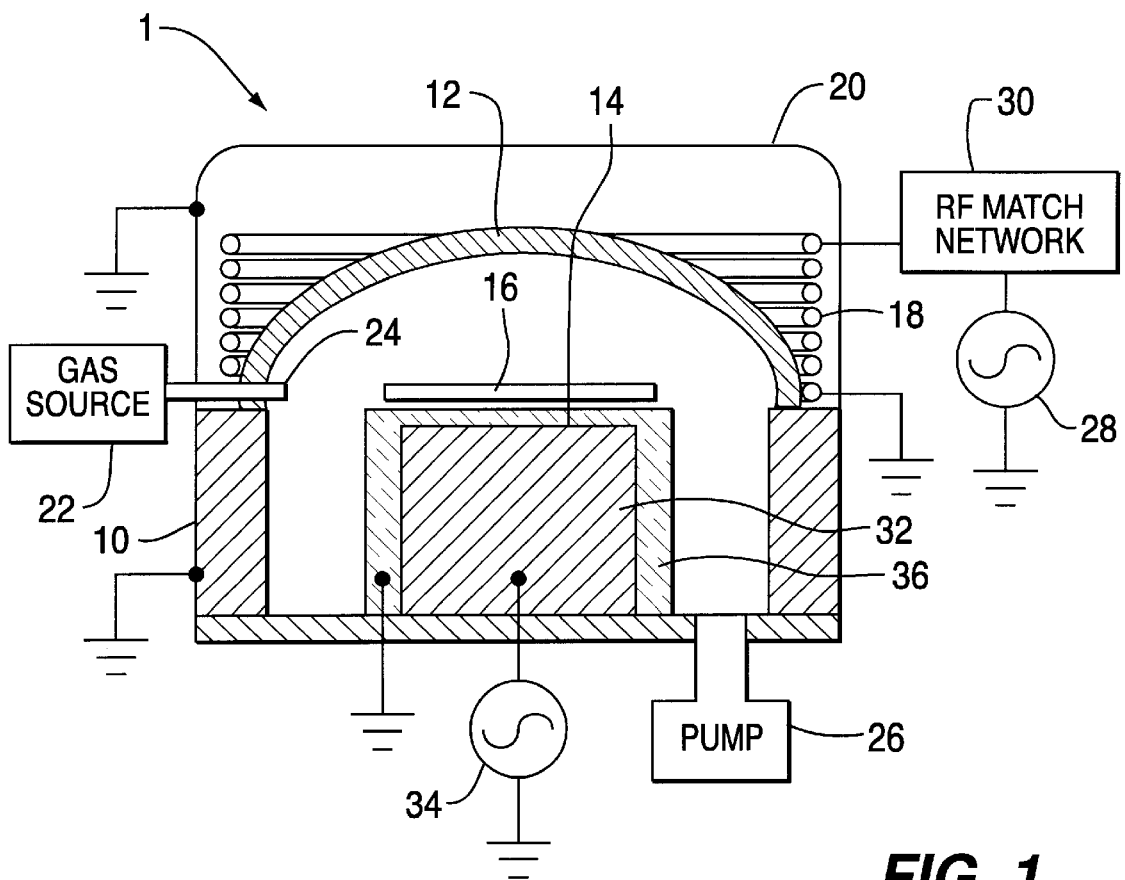
FIG. 1 is a cross sectional, schematic view of an etch reactor suitable for use in the present invention.

The present etch can be carried out suitably in a plasma reactor such as is shown in FIG. 1. This reactor is known as a decoupled plasma source (DPS) reactor. Referring to FIG. 1, an inductively coupled RF plasma reactor includes a reactor chamber 1 having a grounded conductive cylindrical sidewall 10, and a shaped dielectric ceiling 12, e.g., dome-like. The reactor 1 includes a substrate pedestal 14 for supporting a semiconductor substrate 16 in the center of the chamber 1; a cylindrical inductor coil 18 surrounding an upper portion of the chamber beginning near the plane of the top of the substrate 16 or substrate pedestal 14 and extending upwardly therefrom toward the top of the chamber 1; a process gas source 22 and a gas inlet 24 which can be a plurality of inlets spaced about the chamber 1 for furnishing a process gas or gas mixture into the interior of the chamber 1; and a pump 26 for controlling the chamber pressure. The coil inductor 18 is energized by a plasma source power supply or RF generator 28 through a conventional active RF match network 30, the top winding of the coil inductor 18 being "hot" and the bottom winding being grounded. The substrate pedestal 14 includes an interior conductive portion 32 connected to a bias RF power supply or generator 34 and an exterior grounded co-inductor 36 (insulated from the interior conductive portion 32). A conductive grounded RF shield 20 surrounds the coil inductor 18. In accordance with one aspect of the chamber 1, uniformity of the plasma density spatial distribution across the substrate is improved by shaping the ceiling 12 as a multi-radius dome and individually determining or adjusting each one of the multiple radii of the ceiling 12. The multiple-radius dome shape in the embodiment of FIG. 1 has a somewhat flattened shape; the curvature of the dome ceiling 12 around the center portion of the dome has a steeper curvature than the peripheral portion of the dome.

During processing, the power sources are turned on and processing gas is passed into the chamber 1, forming a high density plasma in the chamber 1. The power to the chamber 1 from the inductive RF power source 28 is suitably up to about 3000 watts. The RF source can be a 13.56 MHz power source. The bias power to the substrate support 14 can vary up to 1000 watts, which provides a good etch rate. The bias frequency can vary from about 400 kHz up to about 13.56 MHz, but is preferably about 400 kHz. This provides improved profile control. However, the above frequencies are given for purposes of illustration only and different frequencies can be used. Frequencies as low as 50 kHz and up to 13.56 MHz, and multiples thereof, can be employed.

The pressure in the chamber during processing is important; generally the etch rate increases with pressure, but at higher pressures the selectivity of silicon oxide to the etch mask decreases, as does the etch rate. Thus if the pressure is too high, it is difficult to control the sidewall taper of the growing opening, and the etch becomes more isotropic. Preferably the pressure is about 4 to 10 millitorr.

The power to the chamber 1 from the inductive coil power source is suitably about 400–1000 watts. The bias power to the substrate support can vary from about 20 to 1000 watts.

The substrate is cooled during etch processing, generally by means of a coolant passed to a channel in the substrate support electrode (not shown). In addition, a flow of a coolant gas such as helium can be passed between the substrate 16 and the substrate support 14 to enhance cooling and to maintain the temperature of the substrate within a desired range, generally 0 to about 65° C.

Applicants believe the improvements obtained using the present etchant of a fluorocarbon and an organic silane is due to the deposit of a polymer of silicon and carbon, rather than deposit of a fluorine-containing polymer, onto the etch mask. In the present process, an organosilane including hydrogen, which acts as a scavenger for fluorine, is present. The deposition of a silicon-carbon polymer on the mask protects the mask against etching by the fluorocarbon species. The amount of fluorine in the fluorocarbon etch gas is also reduced by the formation of HF due to the hydrogen atoms present in the organic silane. The addition of the organic silane also provides a carbon-rich polymer along the sidewalls of the etched opening, which improves the selectivity between the silicon oxide being etched and the silicon-containing substrate when it is reached. Thus the addition of an organic silane to a fluorocarbon etch gas increases the selectivity between the silicon oxide and the mask layer without changing the profile of the opening, and inhibits the stop phenomenon during the etch process. In addition, the selectivity between the silicon oxide and an underlying silicon-containing substrate layer is also improved.

Fluorocarbons useful in the present invention are compounds of fluorine, carbon and hydrogen. They can be saturated, unsaturated or cyclic compounds that will form primarily $CF_2^+$, $CF_3^+$ and $C_2F_4^+$ ions in a plasma that will produce a high etch rate. The hydrogen content should be limited so that the ratio of H:F is 1:3 or less, and preferably is 1:8 or less. Preferably the fluorocarbon compound is a low molecular weight compound that contains 5 carbon atoms or less. Oxygen atoms can also be present if they are within the molecular structure (ether oxygen) rather than at the terminals of the molecules (alcohol oxygen). Preferably the ratio of O:F atoms is less than 1:6. Oxygen is believed to bond with carbon atoms in a fluorocarbon plasma, which is removed in gaseous form as $CO$, $CO_2$ and the like. This also reduces the amount of fluorocarbon polymer deposited in the opening by removing carbon ions from the plasma.

Suitable fluorocarbons for use in the present etchant include saturated perfluorocarbons such as $CF_4$, $C_2F_6$, $C_3F_8$ and the like; cyclic perfluorocarbons such as $C_3F_6$, $C_4F_9$ and the like; and hydrogen-containing fluorocarbons such as $CHF_3$, $CH_2F_2$, $C_2HF_5$, $C_2H_2F_4$ and the like. The preferred fluorocarbons are $CF_4$ and $CHF_3$.

Suitable silanes are $SiH_xC_{1-x}$ that include at least one hydrogen atom and one or more organic groups substituted for a hydrogen atom. The organic group can be a saturated alkyl or alkoxy group, or unsaturated groups such as alkenyl groups. Preferably, to inhibit excess polymer formation, the number of carbons in the organic silane is 8 or less, and preferably is 1–4. Such silanes have the formula $Si(alkyl)_x H_{4-x}$ where x is 1–4 and include tetramethylsilane ($Si(CH_3)_4$), trimethylsilane ($SiH(CH_3)_3$), diethylsilane ($Si(CH_3)_2H_2$ or monoethylsilane ($SiH_3C_2H_5$), an alkoxysilane such as ($Si(OC_2H_5)_4$ and the like. The preferred silanes are tetramethyl-, trimethyl- and dimethyl-silanes.

In order to inhibit fluorocarbon polymer formation in the opening, preferably the proportion of organic silane in the fluorocarbon etch gas is in the range of 3–30% by weight, and preferably is 7–15% by weight. In order to maximize the amount of $CF_2^{3+}$, $CF_3^+$ and $C_2F_4^+$ ions in the plasma, the preferred C:F ratio is in the range of 1:4 to 1:1, and preferably is in the range of 1:3 to 1:2.

The silicon oxide layer to be etched is generally deposited on a silicon-containing substrate, which can be crystalline silicon, polysilicon or silicon nitride for example. The thickness of the silicon oxide layer can be up to about 2 microns, but is preferably up to about 700 millimicrons, most preferably up to 600 millimicrons for high aspect ratio openings. A mask layer is deposited thereover and patterned in conventional manner. The mask is a photoresist, preferably one that can withstand an excimer laser light source (for example a KrF laser) for patterning. One such commercially available photoresist is TDURP-007 photoresist manufactured by Tokyo Oka Kagyo KK. A thickness of one micron or less is preferred for the mask layer for easy formation of high integration level LSI. Resist layers as thin as 0.3 micron or less can be used in the present invention because of the etch resistance of the resist to the present etchant mixture.

Using the etchant of the invention, high etch rates for silicon oxide can be obtained, e.g., 0.25–0.5 micron per minute. The selectivity between silicon oxide and photoresist can be from 0.5 to infinity, while selectivity between silicon oxide and silicon can be at least 4 to infinity.

Although a preferred reactor has been described hereinabove for etching silicon oxide, other high density reactive plasma reactors can be used, including helicon wave plasma (HWP) reactors, electron cyclotron resonance (ECR) reactors, neutral magnetic loop discharge (NLD) reactors, surface wave plasma (SWP) reactors, and other known reactors. An inductive coupling plasma reactor as shown in FIG. 1 is preferred since it does not require applying a magnetic field. The inductive coil can have one or more turns.

The invention will be further described in the following examples, but the invention is not meant to be limited to the details described therein. In the Examples, percent is by weight.

EXAMPLE 1

Gas mixtures made by adding 0%, 10%, 20% and 30% of trimethylsilane to a 70 sccm stream of $CF_4$ was fed to a chamber as in FIG. 1. The RF power to the coil was set at 500 Watts. A DC bias having a frequency of 100 kHz was generated by an RF power source connected to the substrate support, and the bias voltage was set at 500V. The pressure during etching was maintained at 10 millitorr. The exhaust pump's effective evacuation rate was 950 l/sec. The substrate was a layer of silicon oxide having a thickness of 2 microns on silicon. A photoresist layer for use with a KrF excimer laser 0.7 micron thick was deposited over the silicon oxide and patterned for openings 0.15 micron in diameter.

Figure 2:
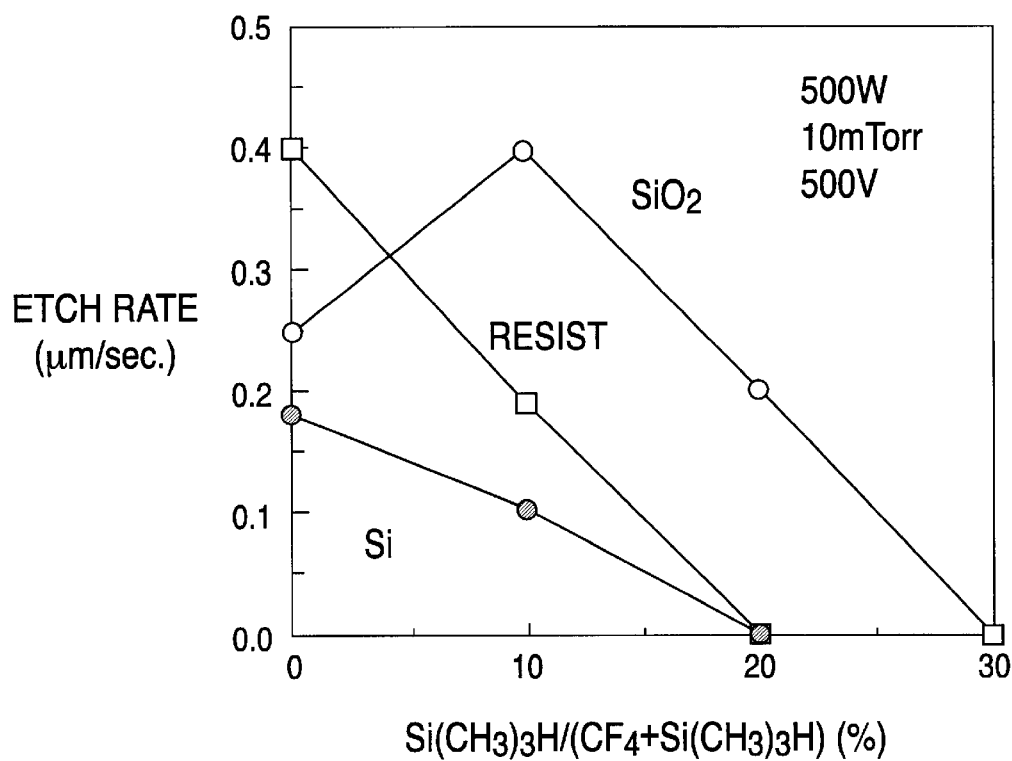
FIG. 2 is a graph of etch rate versus the amount of silane added to a fluorocarbon etch gas for silicon oxide.

The etch rate results are shown in FIG. 2 which is a graph of etch rate in microns/sec versus the amount of trimethylsilane added to the fluorocarbon etch gas. It can be seen that as the amount of the silane added reached about 10% of the fluorocarbon, a maximum etch rate of the silicon oxide was reached; the etch rate of the resist markedly decreased from 0.4 micron/sec when no silane was added to essentially zero when 20% of the silane was added. At this point the selectivity between silicon oxide and the photoresist was infinity. The etch rate of the silicon substrate also decreased from about 0.2 micron/sec when no silane was added to essentially zero when 20% of silane was added, again bringing the selectivity to infinity.

Figure 3:
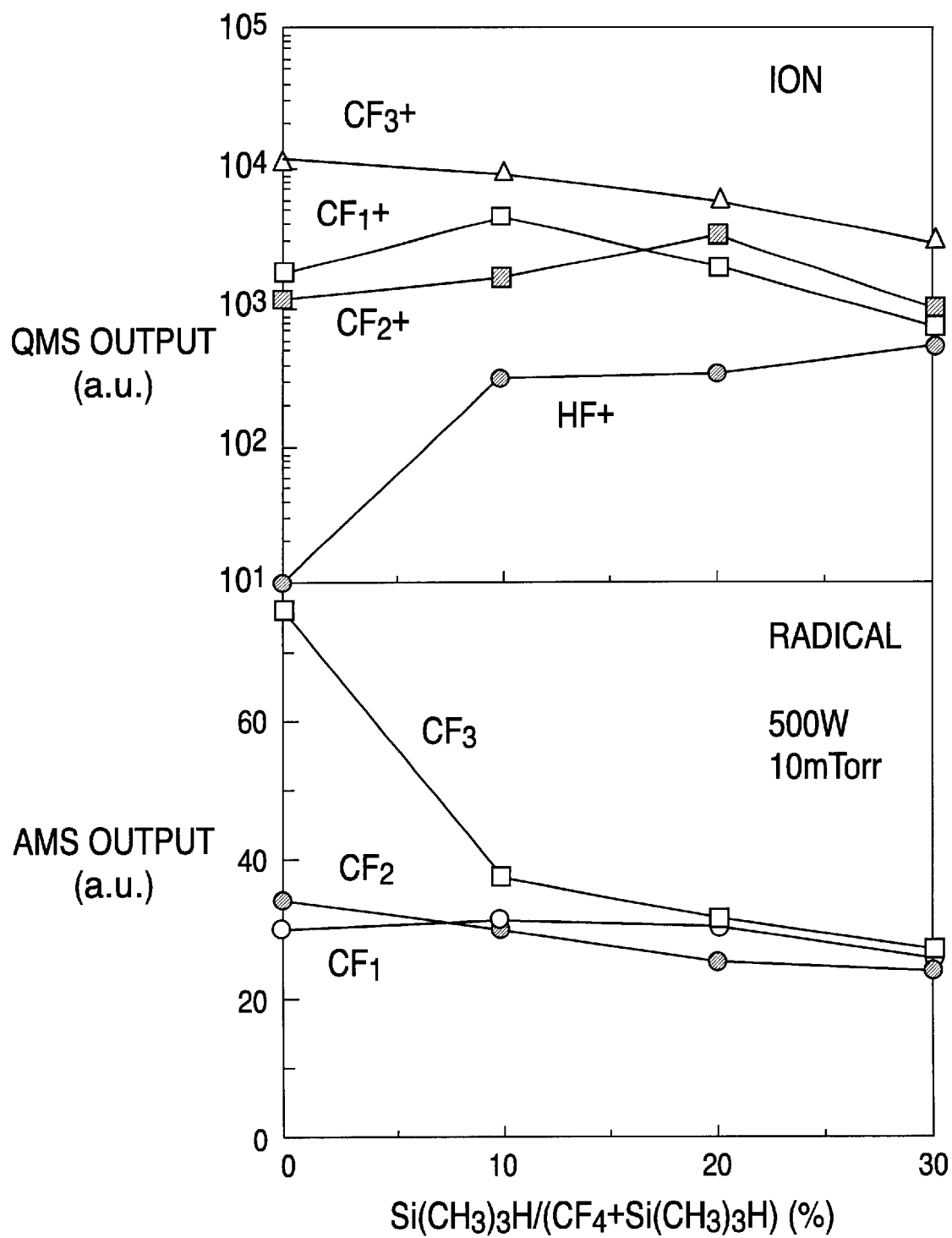
FIG. 3 is a graph of the change in density of various ions and radicals in the fluorocarbon plasma versus the amount of silane added to the fluorocarbon etch gas for silicon oxide.

FIG. 3 is a measure of the number of ions present in the plasma (upper figure) and radicals present in the plasma (lower figure) as increasing trimethylsilane was added to the fluorocarbon etchant. These were measured using a quadrupole mass spectrometer (QMS) and a modified apparent mass spectrometer (AMS) respectively. As trimethylsilane was added, $HF^+$ ions were formed, removing fluorine from the plasma. This leads to a reduction in the silicon etch rate as noted in FIG. 2. There is little decrease in the number of $CF^+$ etchant species thereafter, but there is a decrease in the $CF_3$ radicals, which is believed to inhibit the deposition of fluorocarbon polymer in the openings, preventing the etch stop phenomenon from occurring.

Figure 4:
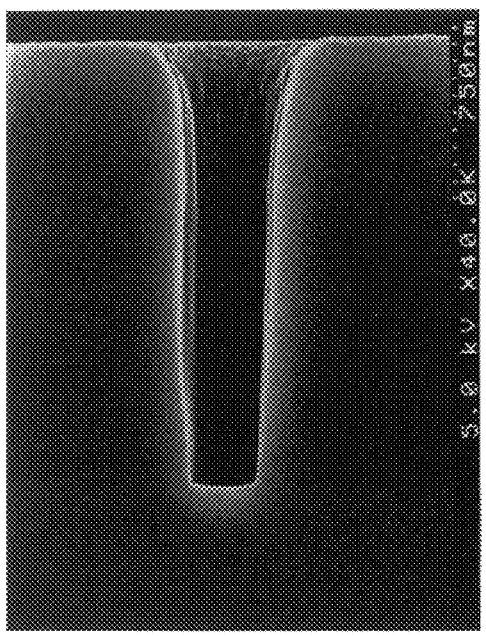
FIG. 4 is a graph of an etched opening in silicon oxide etched with a fluorocarbon etch gas.
Figure 5:
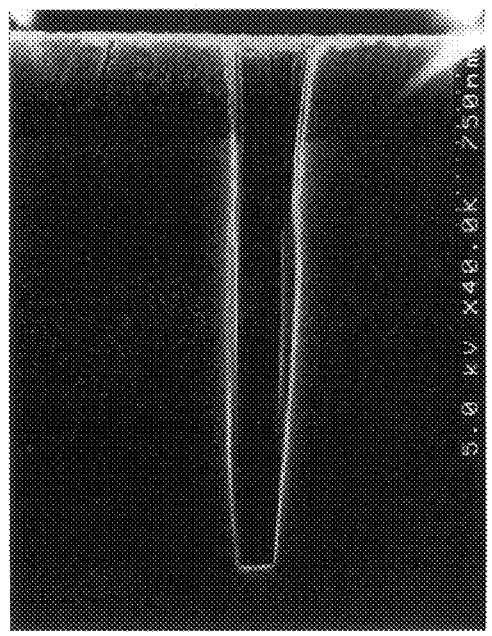
FIG. 5 is a graph of an etched opening in silicon oxide etched with a mixture of a fluorocarbon etch gas containing 15% by weight of an organic silane.

FIG. 4 is a photomicrograph of an etched opening when no trimethylsilane was added, and FIG. 5 is a photomicrograph of an etched opening when 15% of trimethylsilane was added. In FIG. 4, the photoresist layer disappeared and the opening diameter became wider at the top as etching proceeded, indicating isotropic etching. In FIG. 5 however, the photoresist layer is intact, the opening diameter is about the same throughout (straight-walled, vertical opening), and the opening is etched down to the substrate.

EXAMPLE 2

The procedure of Example 1 was followed except that tetramethylsilane ($Si(CH_3)_4$) was used as the silane additive. The results were about the same as in Example 1.

EXAMPLE 3

The procedure of Example 1 was followed except that octofluorobutene ($C_4F_8$) was used as the fluorocarbon etchant gas to which 6% of trimethylsilane was added. The results were about the same as in Example 1.

Thus by exposing silicon oxide to a plasma formed from a fluorocarbon and an organic silane containing only silicon, hydrogen and oxygen, improved selectivity between silicon oxide and a mask, and silicon oxide and a silicon-containing substrate, is achieved. The etch stop phenomenon is also reduced and high aspect ratio openings having submicron diameters can be formed.

Although the present invention has been described using particular gases, particular mask layers and substrate layers, one skilled in the art will know that other materials can be substituted without deviating from the scope of the present invention, which is only to be limited by the scope of the appended claims.

We claim:

1. A method of forming straight walled openings in silicon oxide selectively with respect to both an underlying silicon substrate and to an overlying organic photoresist mask layer comprising forming an etchant gas of a fluorocarbon and at least about 3% by weight of the fluorocarbon of an additive gas of an organosilane including one hydrogen atom and one or more organic groups selected from the group consisting of alkyl groups, alkoxy groups and alkenyl groups, said organosilane having a total number of carbon atoms of no more than 8.

2. A method according to claim 1 wherein the total number of carbon atoms in the organosilane is up to 4.

3. A method according to claim 1 wherein the organosilane is present in an amount of from about 3 to about 10% by weight of the fluorocarbon.

4. A method according to claim 1 wherein the organosilane is present in an amount of from about 7–15% by weight of the fluorocarbon.

5. A method according to claim 1 wherein the organic group is methyl.

* * * * *